United States Patent
Minacapelli et al.

(10) Patent No.: US 9,425,171 B1
(45) Date of Patent: Aug. 23, 2016

(54) REMOVABLE SUBSTRATE FOR CONTROLLING WARPAGE OF AN INTEGRATED CIRCUIT PACKAGE

(71) Applicant: NVIDIA CORPORATION, Santa Clara, CA (US)

(72) Inventors: Joseph Minacapelli, Sunnyvale, CA (US); Teckgyu (Terry) Kang, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/751,023

(22) Filed: Jun. 25, 2015

(51) Int. Cl.
*H01L 21/50* (2006.01)
*H01L 25/065* (2006.01)
*H01L 25/00* (2006.01)

(52) U.S. Cl.
CPC ............ *H01L 25/0657* (2013.01); *H01L 25/50* (2013.01); *H01L 2225/06513* (2013.01); *H01L 2225/06589* (2013.01)

(58) Field of Classification Search
CPC ............... H01L 25/0657; H01L 25/50; H01L 2225/06513; H01L 22/20; H01L 33/48
USPC ...................................... 438/107, 5
See application file for complete search history.

(56) References Cited

U.S. PATENT DOCUMENTS

| | | | |
|---|---|---|---|
| 2006/0035413 A1* | 2/2006 | Rae | H01L 23/36 438/122 |
| 2006/0087033 A1* | 4/2006 | Goh | H01L 23/04 257/737 |
| 2009/0152713 A1* | 6/2009 | Sauciuc | H01L 23/3737 257/713 |
| 2015/0130045 A1* | 5/2015 | Tseng | H01L 23/36 257/712 |
| 2015/0155221 A1* | 6/2015 | Chen | H01L 24/17 257/690 |

\* cited by examiner

*Primary Examiner* — Julio J Maldonado
*Assistant Examiner* — Omar Mojaddedi
(74) *Attorney, Agent, or Firm* — Artegis Law Group, LLP

(57) ABSTRACT

One embodiment of the present invention sets forth a technique for packaging an integrated circuit die. The technique includes bonding a first surface of the integrated circuit die to a first substrate via a first plurality of solder bump structures and bonding a second substrate to a second surface of the integrated circuit die. The technique further includes bonding the first substrate to a third substrate via a second plurality of solder bump structures and, after bonding the first substrate to the third substrate, removing the second substrate from the second surface of the integrated circuit die. The technique further includes disposing a heat sink on the second surface of the integrated circuit die.

20 Claims, 6 Drawing Sheets

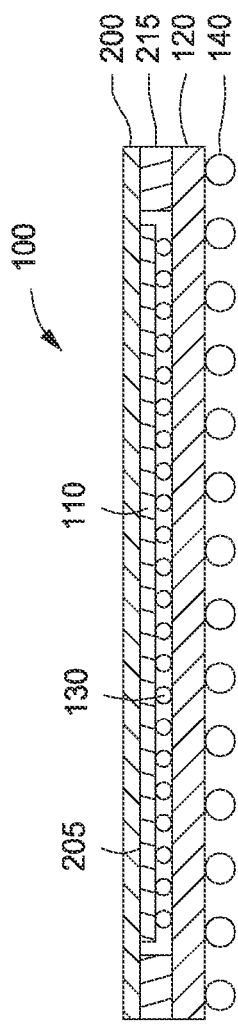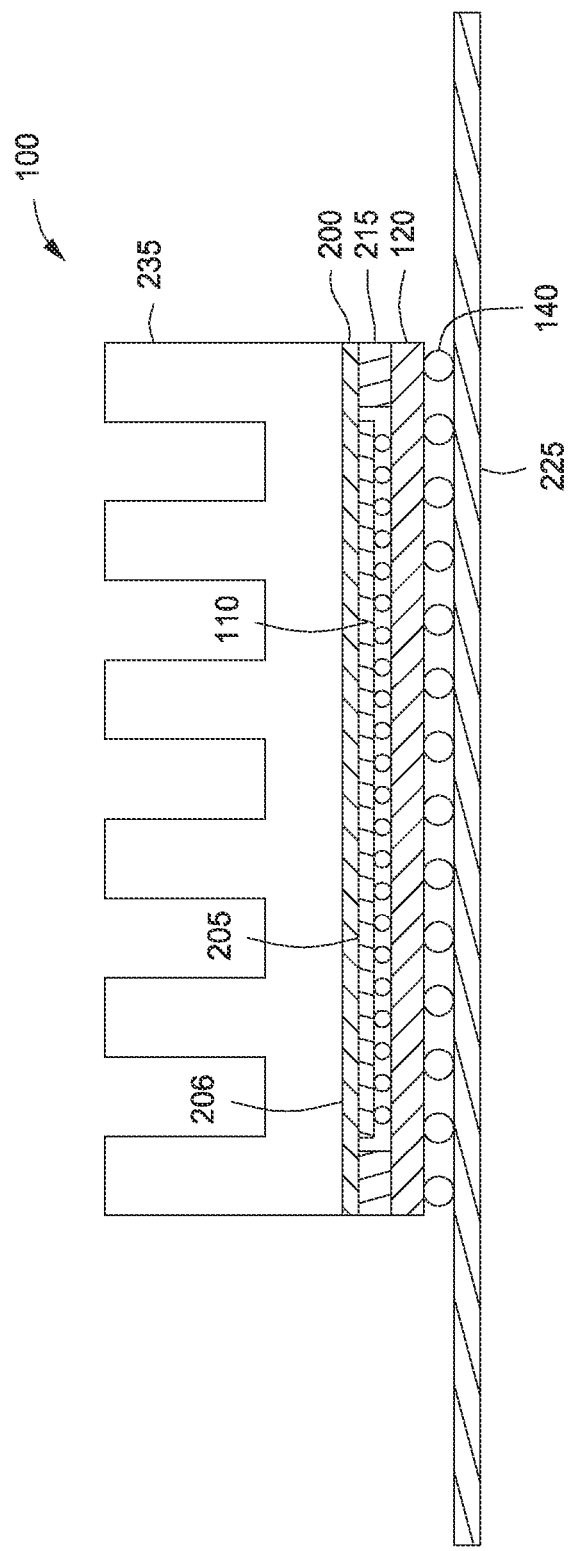

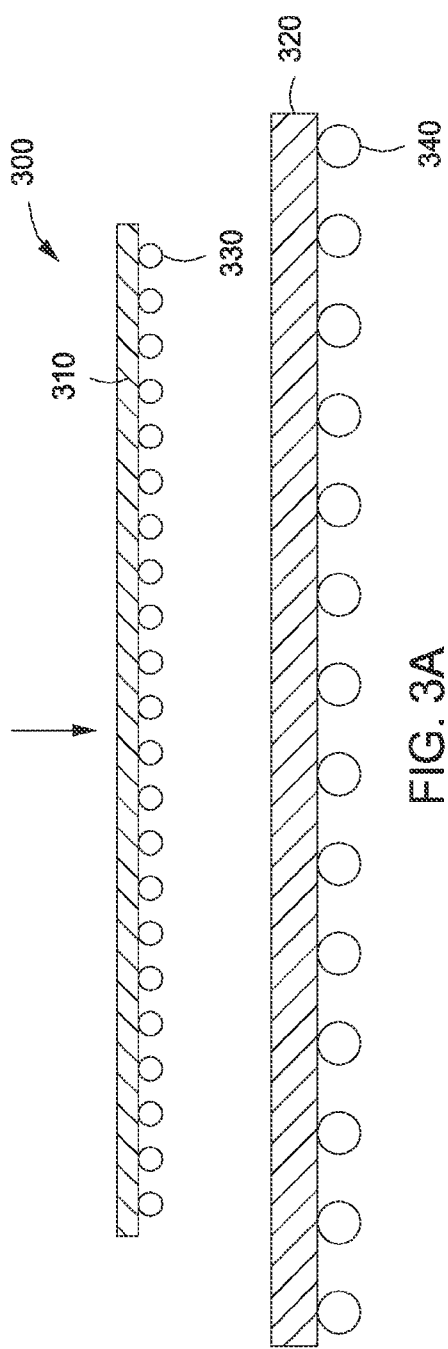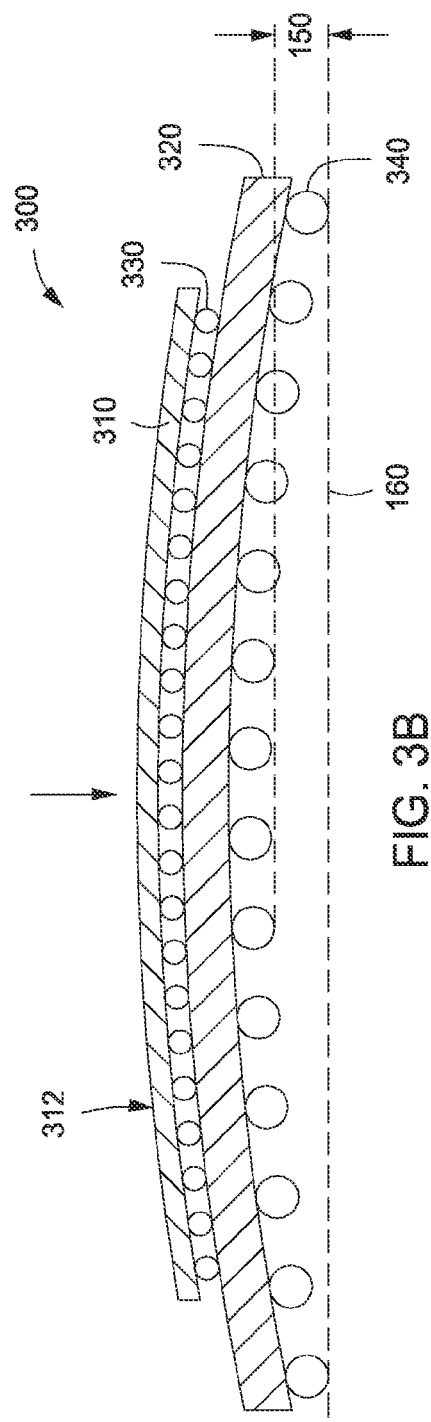

REMOVABLE SUBSTRATE FOR CONTROLLING WARPAGE OF AN INTEGRATED CIRCUIT PACKAGE

BACKGROUND OF THE INVENTION

1. Field of the Invention

Embodiments of the present invention relate generally to integrated circuit fabrication and packaging and, more specifically, to a removable substrate for controlling warpage of an integrated circuit package

2. Description of the Related Art

Integrated circuit (IC) fabrication is a multi-step sequence that includes processes such as patterning, deposition, etching, and metallization. Typically, in the final processing steps, the resulting IC die are separated and packaged. IC packaging serves several purposes, including providing an electrical interface with the die, providing a thermal medium through which heat may be removed from the die, and/or providing mechanical protection for the die during subsequent usage and handling.

One type of IC packaging technique is referred to as "flip chip" packaging. In flip chip packaging, after the metallization process is complete, solder bump structures (e.g., solder balls, pads, etc.) are deposited on the die, and the die is separated from the wafer (e.g., via dicing, cutting, etc.). The die is then inverted and positioned on a substrate so that the solder bumps align with electrical connections formed on the substrate. Heat is applied via a solder reflow process to re-melt the solder bumps and attach the die to the substrate. The die/substrate assembly may further be underfilled with a non-conductive adhesive to strengthen the mechanical connection between the die and the substrate.

IC fabrication techniques have enabled the production of larger-sized die having increasingly high transistor densities. Consequently, IC packaging techniques have encountered challenges for providing packaging capable of supporting the requisite number of electrical connections. Specifically, as the size of the die and number of electrical connections to the die is increased, the size of the package generally is increased. Further, as package size is increased, the thermal properties of the die and packaging materials become a more important factor.

One relevant thermal property of the die and packaging materials is the coefficient of thermal expansion (CTE). In flip chip packaging, for example, during the solder reflow process, the die is attached to the substrate at an elevated temperature. Upon cooling, a mismatch between the CTE of the die and the CTE of the substrate may cause the substrate to warp, thereby reducing the planarity of the IC package and preventing electrical connections from being formed with the IC package. Additionally, warping of the IC package typically degrades the electrical connections provided between the die and the substrate. Consequently, IC packages that experience significant warping are oftentimes discarded for being outside of specification requirements.

In order to reduce warping of the IC package, some conventional packaging techniques permanently bond a substrate (commonly referred to as a "lid") to the IC package. For example, in many techniques, a lid having a thickness of less than 1 millimeter is bonded on top of one or more IC dies included in the IC package. A heat sink is then positioned on top of the lid in order to dissipate heat generated during operation of the IC die(s).

One disadvantage to this technique is that the lid insulates the IC die(s) from the heat sink, which reduces the rate at which heat can be removed from the IC package via the heat sink. Consequently, although bonding the lid to the IC package reduces the amount of warping of the IC package, the lid may cause the IC die(s) to overheat and/or reduce the overall performance characteristics of the IC die(s).

As the foregoing illustrates, more effective techniques for reducing the amount of warping in IC packages would be useful.

SUMMARY OF THE INVENTION

One embodiment of the present invention sets forth a method for packaging an integrated circuit die. The method includes bonding a first surface of the integrated circuit die to a first substrate via a first plurality of solder bump structures and bonding a second substrate to a second surface of the integrated circuit die. The method further includes bonding the first substrate to a third substrate via a second plurality of solder bump structures and, after bonding the first substrate to the third substrate, removing the second substrate from the second surface of the integrated circuit die. The method further includes disposing a heat sink on the second surface of the integrated circuit die.

At least one advantage of the techniques described herein is that the amount of warping of the IC package is reduced, enabling electrical connections to be more reliably formed between the IC package and a circuit board onto which the package is to be bonded. Further, the techniques described herein reduce the number of thermal interfaces between the IC die and the heat sink and enable the heat sink to be coupled to the IC die via only a thin layer of thermal interface material. Consequently, cooling of the IC package via the heat sink is improved.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A and 2B illustrate schematic views of a lid bonded to an upper surface of the IC package of FIG. 1B;

FIGS. 3A-3F illustrate schematic views of a technique for temporarily coupling a rigid substrate to an integrated circuit (IC) package to reduce an amount of warping of the IC package, according to various embodiments of the present invention.

DETAILED DESCRIPTION

In the following description, numerous specific details are set forth to provide a more thorough understanding of the embodiments of the present invention. However, it will be apparent to one of skill in the art that the embodiments of the present invention may be practiced without one or more of these specific details.

Figure 1A:
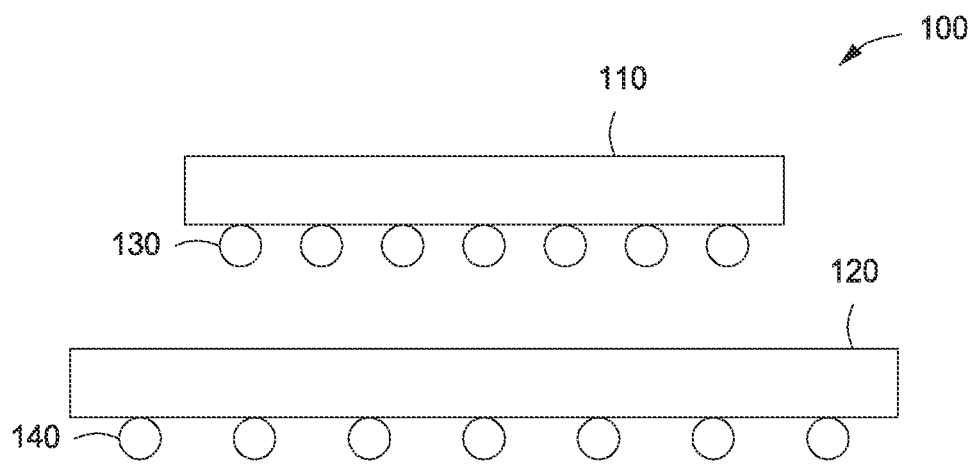
FIGS. 1A and 1B illustrate schematic views of an integrated circuit (IC) package having a conventional configuration.
Figure 1B:
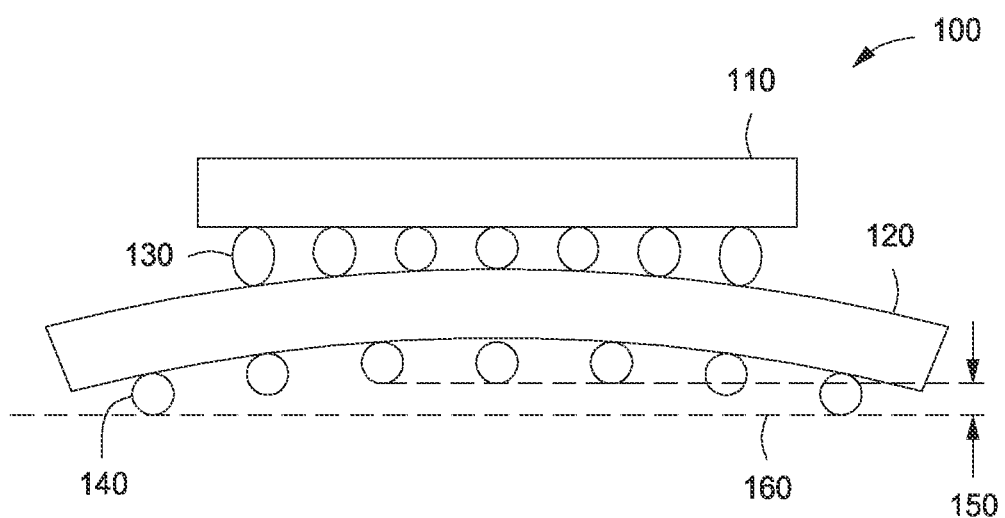

FIGS. 1A and 1B illustrate schematic views of an integrated circuit (IC) package 100 having a conventional configuration. The conventional IC package 100 includes an IC die 110, a substrate 120, a first plurality of solder balls 130, and a second plurality of solder balls 140. The first plurality of solder balls 130 mechanically and electrically couple the IC die 110 to the substrate 120 and provide electrical connections between the IC die 110 and the substrate 120. The second plurality of solder balls 140 mechanically and electrically couple the conventional IC package 100 to a circuit board (not shown) and provide electrical connections between the conventional IC package 100 and the circuit board.

As shown in FIG. 1A, prior to bonding the IC die 110 to the substrate 120, the second plurality of solder balls 140 are substantially coplanar. During bonding, the first plurality of solder balls 130 are aligned with and placed into contact with electrical connections formed on the substrate 120. The IC die 110 and the substrate 120 are then heated to a similar temperature, melting the solder balls 130 and mechanically and electrically coupling the IC die 110 to the substrate 120.

After bonding the IC die 110 to the substrate 120, the conventional IC package 100 is cooled to room temperature (e.g., about 23° C.). However, as shown in FIG. 1B, due to a mismatch between the coefficient of thermal expansion (CTE) of the IC die 110 and the CTE of the substrate 120, the substrate 120 and/or the IC die 110 experience warping when the conventional IC package 100 is cooled. As a result, the coplanarity 150 of the second plurality of solder balls 140 bonded to the bottom surface of the substrate 120 is reduced.

Coplanarity is a term used to describe the degree to which objects lie in the same plane. As the term is used in the field of IC packaging, coplanarity may be defined as the difference between the height of the highest solder bump structure and the height of the seating plane 160. For example, as shown in FIG. 1B, the coplanarity 150 of the conventional IC package 100 is determined by the difference between the height of the center solder balls 140 and the height of the seating plane 160 upon which the rightmost and leftmost solder balls 140 lie. An increase in the height of a solder ball above the seating plane 160 represents a decrease in coplanarity.

A decrease in coplanarity may prevent one or more solder bump structures from forming a proper mechanical and/or electrical connection with a substrate or circuit board onto which an IC package is to be mounted. Moreover, because IC package coplanarity is typically required to meet certain requirements in order to ensure proper mechanical and electrical connectivity with other device components, a significant decrease in coplanarity may decrease IC package assembly yields.

FIGS. 2A and 2B illustrate schematic views of a lid 200 bonded to an upper surface of the IC package 100 of FIG. 1B. In conventional packaging techniques, variations in the coplanarity of an IC package (e.g., due to a CTE mismatch) are mitigated by permanently bonding a lid 200 to a surface of the IC package. For example, a lid 200 having a thickness of less than 1 millimeter typically is bonded to one or more IC dies 110 and/or a stiffening structure 215 in order to provide additional rigidity to and reduce the amount of warping of the IC package 100. A heat sink 235 is then disposed on top of the lid 200 in order to dissipate heat generated during operation of the IC die 110.

Although the lid 200 mitigates warpage of the IC package 100, the lid 200 also acts as an insulator, reducing the rate at which heat can be transferred from the IC die 110 to the heat sink 235. Moreover, bonding the lid 200 between the IC die 110 and the heat sink 235 creates two distinct thermal interfaces—a first interface 205 between the IC die 110 and the lid 200 and a second interface 206 between the lid 200 and the heat sink 235. In general, increasing the number of thermal interfaces across which heat must be transferred reduces the rate at which heat can be removed from the IC die 110 via the heat sink 235.

To address these and other deficiencies of conventional packaging techniques, in various embodiments, a rigid substrate is temporarily coupled to the IC package to reduce the amount of warping of the package and improve the coplanarity of the solder bump structures coupled to the substrate. Then, while the rigid substrate is coupled to the IC package, the IC package is bonded to a circuit board (e.g., a motherboard) or another type of substrate. After the IC package is bonded to the circuit board or other substrate, the rigid substrate is removed from the IC package, and a heat sink is disposed onto the IC die(s) included in the IC package.

Advantageously, temporarily coupling a rigid substrate to the IC package to reduce the amount of warping of the IC package enables electrical connections to be more reliably formed between the IC package and a circuit board or other substrate onto which the IC package is to be bonded. Further, enabling the rigid substrate to be removed from the IC package after bonding the IC package to the circuit board enables the heat sink to be coupled to the IC die(s) via only a thin layer of thermal interface material. Consequently, cooling of the IC package may be improved. Such techniques for processing an IC package are described below in further detail in conjunction with FIGS. 3A-4.

FIGS. 3A-3F illustrate schematic views of a technique for temporarily coupling a rigid substrate 350 to an integrated circuit (IC) package 300 to reduce an amount of warping of the IC package, according to various embodiments of the present invention. As shown, the IC package 300 includes an IC die 310, a substrate 320, a first plurality of solder bump structures 330, and a second plurality of solder bump structures 340.

As shown in FIGS. 3A and 3B, the IC die 310 is bonded to the substrate 320 by aligning the first plurality of solder bump structures 330 with the substrate 320 and lowering the IC die 310 onto the substrate 320. The IC die 310 and the substrate 320 are then heated to a similar temperature (e.g., a solder reflow temperature), melting the solder bump structures 330 and mechanically and electrically coupling the IC die 310 to the substrate 320. After bonding the IC die 310 to the substrate 320, the IC package 300 is cooled to room temperature, causing the substrate 320 and/or the IC die 310 to warp (e.g., due to a CTE mismatch), as shown in FIG. 3B.

Figure 3C:
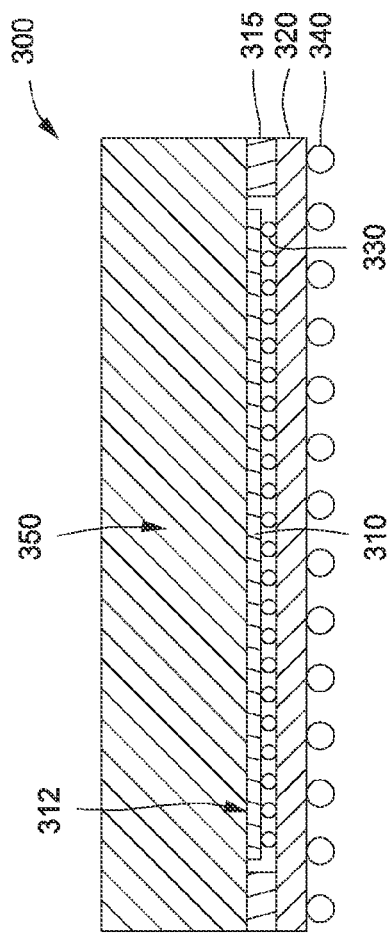

In order to reduce the amount of warping of the substrate 320 and/or the IC die 310 prior to bonding the IC package 300 to a circuit board, a rigid substrate 350 is temporarily coupled to a surface 312 of the IC package 300, as shown in FIG. 3C. In some embodiments, a temporary adhesive is used to couple the rigid substrate 350 to both a surface 355 of a stiffening structure 315 disposed in the IC package 300 as well as to the surface 312 of the IC die 310 itself. For example, the rigid substrate 350 could be coupled to a stiffening ring disposed around the perimeter of the IC die 310. In other embodiments, the rigid substrate 350 is coupled to either the stiffening structure 315 or to one or more IC die(s) 310 included in the IC package 300. In still other embodiments, the rigid substrate 350 is temporarily coupled via any other technically feasible manner to one or more components of the IC package 300 to reduce the amount of warping of the IC package 300.

Figure 3D:
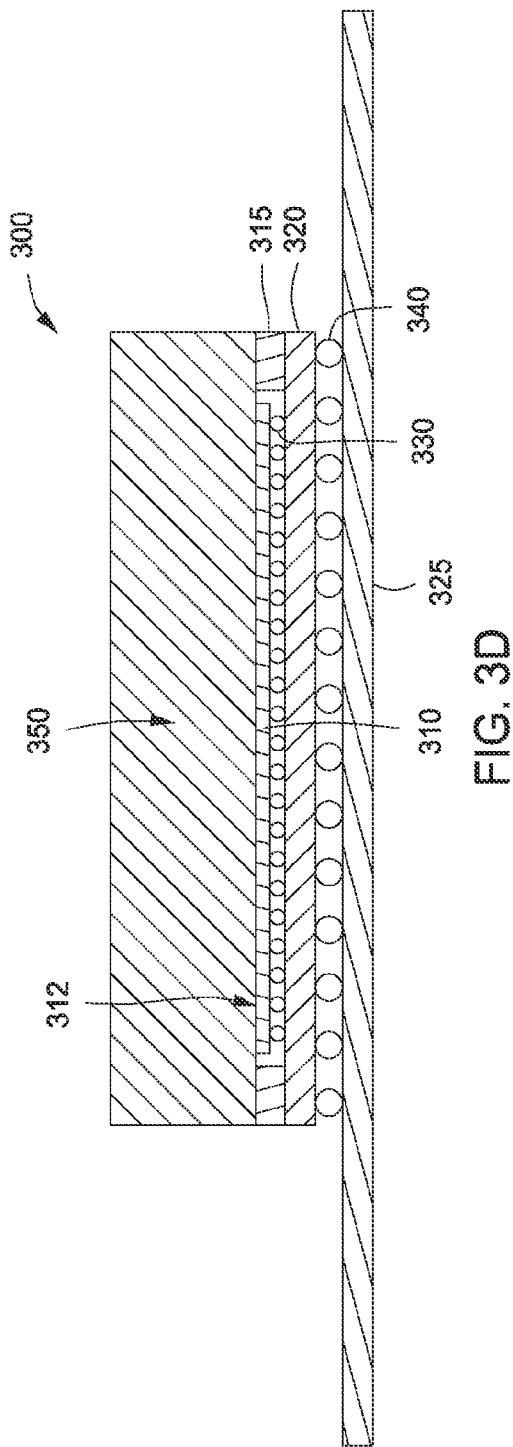
Figure 3E:
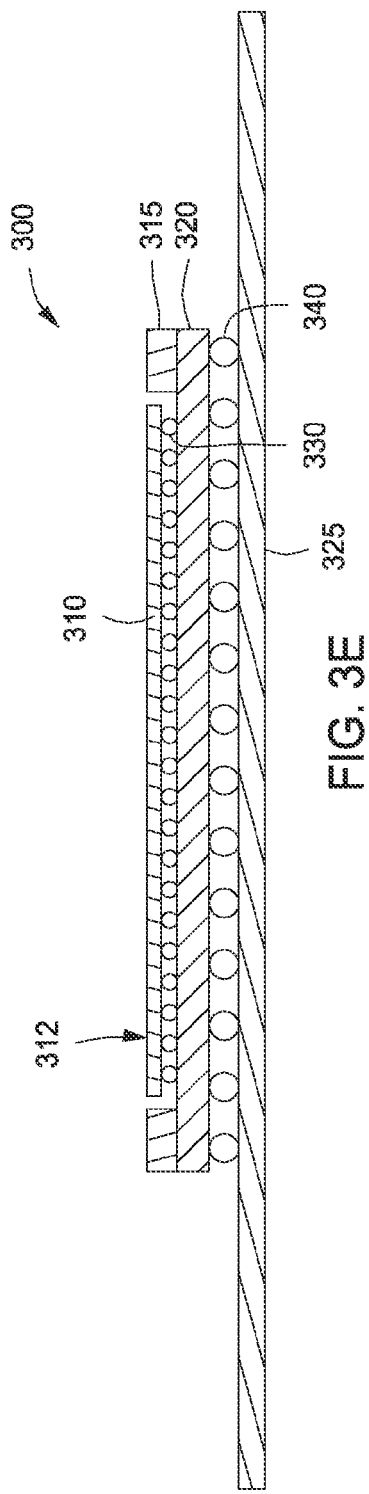
Figure 3F:
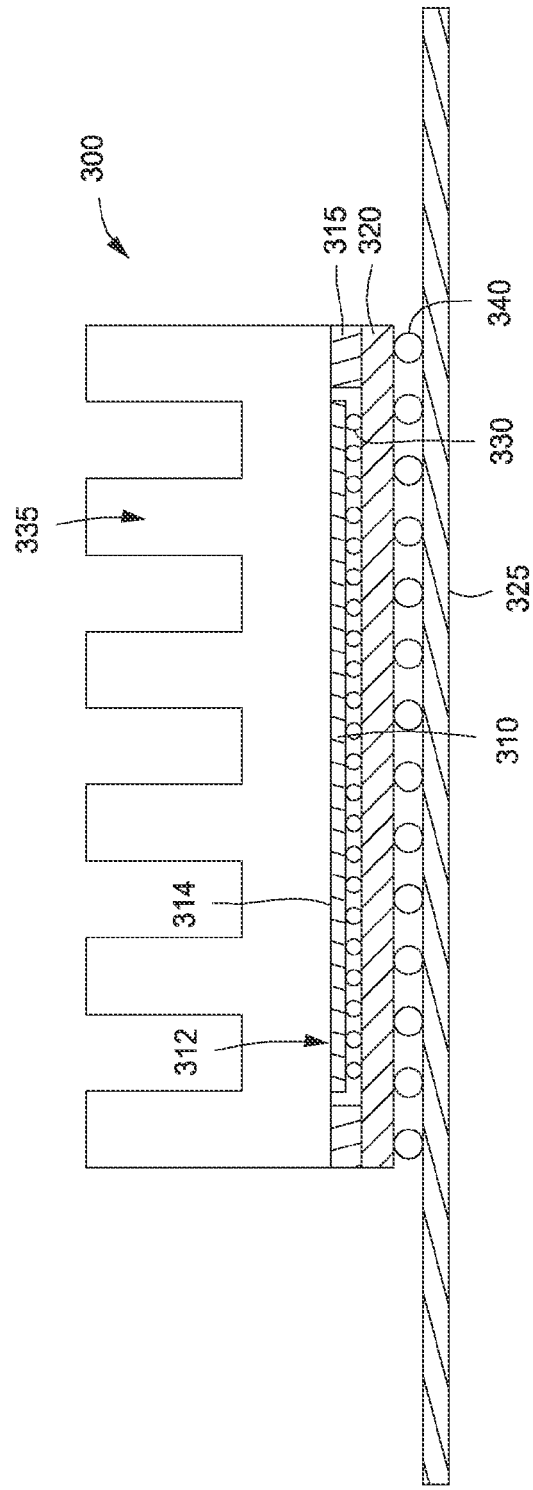

As shown in FIG. 3D, while the rigid substrate 350 is coupled to the IC package 300, the IC package 300 is bonded to a circuit board 325 (or another type of substrate) by heating the IC die 310 and/or the substrate 320 to the melting point of the second plurality of solder bump structures 340. The IC package 300 is then cooled (e.g., to room temperature), and the rigid substrate 350 is removed from the surface of the IC package 300, as shown in FIG. 3E. Additionally, after removal of the rigid substrate 350, the surface 312 of the IC package 300 (e.g., the surface of the IC die(s) 310, stiffening structure 315, etc.) is optionally cleaned to remove residual adhesive. A heat sink 335 is then bonded to the surface 312 of the IC package 300, as shown in FIG. 3F.

Removing the rigid substrate 350 prior to disposing the heat sink 335 on the IC package 300 enables the heat sink 335 to be coupled to the IC die(s) 310 such that the heat sink 335 and the IC die(s) 310 are in direct contact or are separated by only a thin layer of thermal interface material (e.g., a thermal compound that includes thermally conductive particles). Additionally, removing the rigid substrate 350 prior to disposing the heat sink 335 on the IC package 300 reduces the number of thermal interfaces between the IC die(s) 310 and the heat sink 335. For example, in the configuration shown in FIG. 3F, the IC die 310 and the heat sink 335 are coupled via a single layer of thermal interface material 314, improving the efficiency with which heat can be transferred from the IC die 310 to the heat sink 335 and, thus, increasing the overall cooling efficiency of the IC package 300.

Additionally, because the rigid substrate 350 is only temporarily coupled to the IC package 300, the rigid substrate 350 may have a thickness that is greater than 1 millimeter (e.g., approximately 5 millimeters or more), providing increased rigidity and further reducing the amount of warping of the IC package 300. By contrast, conventional techniques that permanently bond a lid 200 to a conventional IC package 100 require the lid 200 to have a thickness of less than approximately 1 millimeter to ensure that the overall height of the IC package 100 does not exceed clearance requirements of processing equipment in which the IC package 100 must be positioned during packaging.

In various embodiments, the rigid substrate 350 may include a reusable material, such as a ceramic (e.g., glass) or a metal alloy (e.g., steel), that is able to withstand the temperatures required for reflow of the second plurality of solder bump structures 340 (e.g., approximately 200° C.) without softening and/or melting. Further, in various embodiments, the rigid substrate 350 is coupled to the stiffening structure 315 and/or the IC die 310 via a temporary adhesive that is able to withstand the temperatures required for the reflow of the second plurality of solder bump structures 340. Examples of a temporary adhesive that may be used to couple the rigid substrate 350 to the IC package 300 include chemically-activated adhesives and light-activated adhesives, such as a polymer-based adhesive.

In some embodiments, the rigid substrate 350 includes a transparent or semi-transparent material, such as glass, and the temporary adhesive includes a light-activated adhesive. In such embodiments, the rigid substrate 350 can be removed from the IC package 300 by exposing a light-activated adhesive (e.g., a polyimide adhesive) to light, such as by shining light within the ultraviolet range through the rigid substrate 350 and onto the light-activated adhesive. In such embodiments, the light may break polymeric bonds associated with the light-activated adhesive, causing the rigid substrate 350 to be released from the IC package 300.

In other embodiments, the rigid substrate 350 may be coupled to the IC package 300 via a chemically-activated adhesive. In such embodiments, the rigid substrate 350 can be removed from the IC package 300 by exposing the temporary adhesive to a chemical, such as a solvent that dissolves the temporary adhesive and/or weakens polymeric bonds associated with the temporary adhesive.

The heat sink 335 includes a thermally conductive material, such as copper or aluminum. The substrate 320 and/or the circuit board 325 may include organic materials and/or conductive materials. For example, the substrate 320 and/or the circuit board 325 could include one or more layers of electrically conductive routing laminated with one or more polymeric layers to form a substrate, such as a printed circuit board (PCB).

Figure 4:
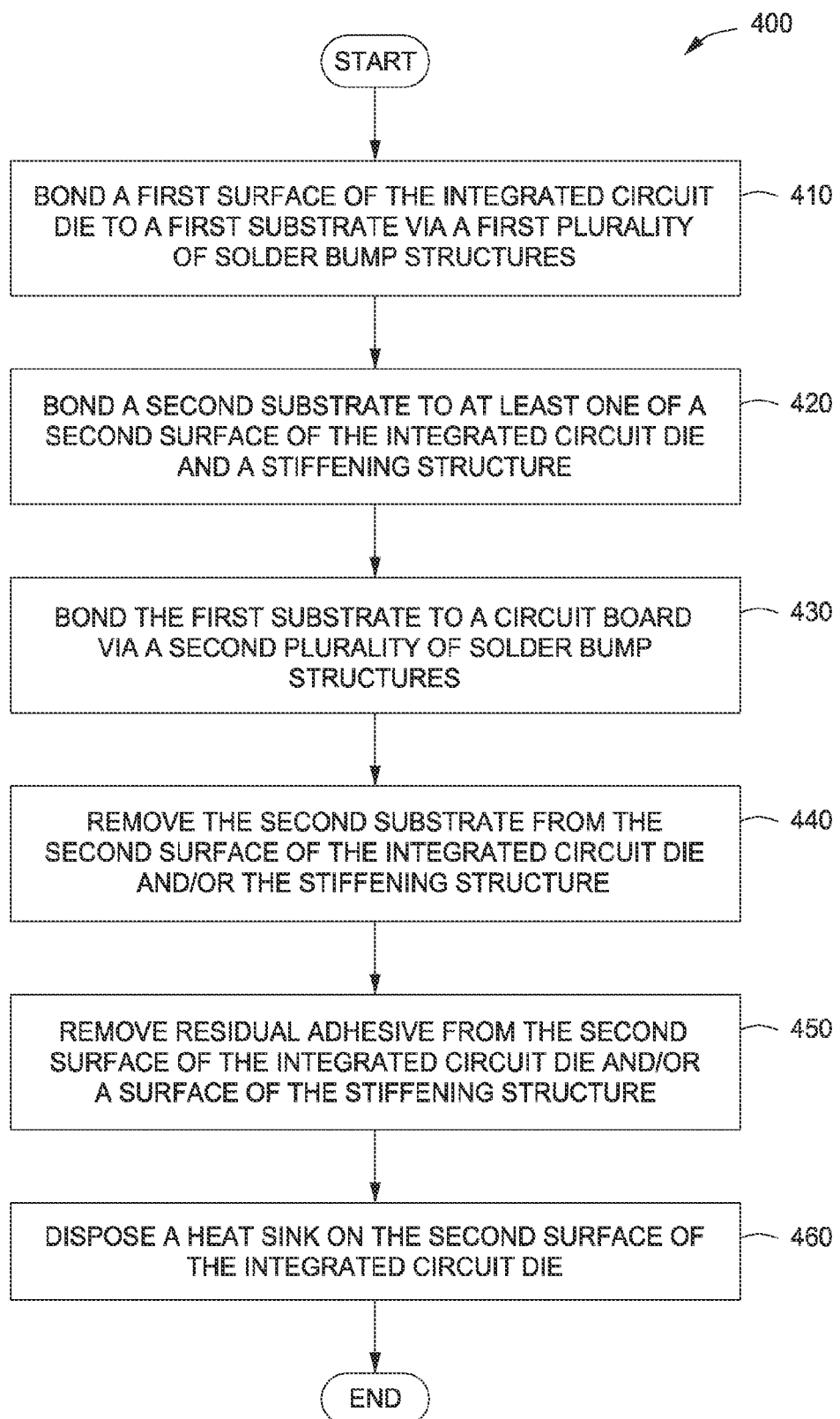
FIG. 4 is a flow diagram of method steps for packaging an integrated circuit die, according to various embodiments of the present invention.

FIG. 4 is a flow diagram of method steps for packaging an integrated circuit die, according to various embodiments of the present invention. Although the method steps are described in conjunction with the structures of FIGS. 3A-3F, persons skilled in the art will understand that any structures formed via the method steps, in any order, fall within the scope of the present invention.

As shown, a method 400 begins at step 410, where a first surface of the IC die 310 is bonded to the substrate 320 via the first plurality of solder bump structures 330. At step 420, the rigid substrate 350 is bonded to at least one of a second surface of the IC die 310 and the stiffening structure 315. As described above, in various embodiments, the rigid substrate 350 may be bonded to the second surface of the IC die 310 and/or the stiffening structure 315 via a temporary adhesive, such as a light-activated and/or chemically-activated adhesive.

Next, at step 430, the substrate 320 is bonded to the circuit board 325 or another type of substrate via the second plurality of solder bump structures 340. At step 440, after the substrate 320 has been bonded to the circuit board 325 or other substrate, the rigid substrate 350 is removed from the second surface of the IC die 310 and/or the stiffening structure 315. In various embodiments, removal of the rigid substrate 350 from the second surface of the IC die 310 and/or the stiffening structure 315 is performed by exposing the temporary adhesive to a light, such as an ultraviolet laser, and/or by exposing the temporary adhesive to one or more chemical compounds, such as a solvent.

At step 450, the second surface of the IC die 310 and/or a surface of the stiffening structure 315 are optionally cleaned to remove residual adhesive. Then, at step 460, the heat sink 335 is disposed on the second surface of the IC die 310. In some embodiments, the heat sink 335 is disposed directly on the second surface of the IC die 310, while in other embodiments, only a thin layer of thermal interface material is disposed between the heat sink 335 and the IC die 310. The method 400 then ends.

In sum, a rigid substrate is temporarily coupled to an IC package to reduce the amount of warping of the package and improve the coplanarity of the solder bump structures coupled to the substrate. Then, while the rigid substrate is coupled to the IC package, the IC package is bonded to a circuit board. After the IC package is bonded to the circuit board, the rigid substrate is removed from the IC package, and a heat sink is disposed onto one or more IC die(s) included in the IC package.

At least one advantage of the techniques described herein is that the amount of warping of the IC package is reduced, enabling electrical connections to be more reliably formed between the IC package and a circuit board or other substrate onto which the package is to be bonded. Further, the techniques described herein reduce the number of thermal interfaces between the IC die and the heat sink and enable the heat sink to be coupled to the IC die via only a thin layer of thermal interface material. Consequently, cooling of the IC package via the heat sink is improved.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to specific types of substrates, adhesives, and IC dies, persons skilled in the art will appreciate that the systems and techniques described herein are applicable to other types of substrates, adhesives, and IC dies. The foregoing description and drawings are, accordingly, to be regarded in an illustrative rather than a restrictive sense.

While the preceding is directed to embodiments of the present disclosure, other and further embodiments of the disclosure may be devised without departing from the basic scope thereof, and the scope thereof is determined by the claims that follow.

What is claimed is:

1. A method for packaging an integrated circuit die, the method comprising:
   bonding a first surface of the integrated circuit die to a first substrate via a first plurality of solder bump structures;
   bonding a second substrate to a second surface of the integrated circuit die;
   bonding the first substrate to a third substrate via a second plurality of solder bump structures;
   after bonding the first substrate to the third substrate, removing the second substrate from the second surface of the integrated circuit die; and
   disposing a heat sink on the second surface of the integrated circuit die.

2. The method of claim 1, wherein bonding the second substrate to the second surface of the integrated circuit die comprises disposing a temporary adhesive between the second substrate and the second surface of the integrated circuit die.

3. The method of claim 2, wherein removing the second substrate from the second surface of the integrated circuit die comprises exposing the temporary adhesive to a first wavelength of light.

4. The method of claim 3, wherein the first wavelength of light is within the ultraviolet range.

5. The method of claim 4, wherein the second substrate comprises a semi-transparent substrate.

6. The method of claim 5, wherein the second substrate comprises glass.

7. The method of claim 5, wherein the temporary adhesive comprises a polyimide.

8. The method of claim 2, wherein removing the second substrate from the second surface of the integrated circuit die comprises exposing the temporary adhesive to a chemical compound.

9. The method of claim 2, wherein the second substrate comprises a metal alloy having a softening point above approximately 200 degrees Celsius.

10. The method of claim 2, wherein the second substrate comprises a ceramic.

11. The method of claim 2, wherein the temporary adhesive can withstand a temperature of at least 200 degrees Celsius without releasing the second substrate from the second surface of the integrated circuit die.

12. The method of claim 1, wherein, after bonding the second substrate to the second surface of the integrated circuit die, the second plurality of solder bump structures are substantially coplanar.

13. The method of claim 1, wherein the third substrate comprises a circuit board.

14. A method for packaging an integrated circuit die, the method comprising:
bonding a first surface of the integrated circuit die to a first substrate via a first plurality of solder bump structures;
bonding a surface of the second substrate to a stiffening structure disposed proximate to the integrated circuit die, wherein the surface of the second substrate and a second surface of the integrated circuit die are facing each other;
bonding the first substrate to a circuit board via a second plurality of solder bump structures;
after bonding the first substrate to the circuit board, removing the second substrate from the stiffening structure; and
disposing a heat sink on the second surface of the integrated circuit die.

15. The method of claim 14, wherein bonding the second substrate to the stiffening structure comprises disposing a temporary adhesive between the second substrate and the stiffening structure.

16. The method of claim 15, wherein the second substrate comprises a semi-transparent substrate, and removing the second substrate from the stiffening structure comprises exposing the temporary adhesive to a first wavelength of light.

17. The method of claim 16, wherein the first wavelength of light is within the ultraviolet range.

18. The method of claim 15, wherein removing the second substrate from the stiffening structure comprises exposing the temporary adhesive to a chemical compound.

19. The method of claim 15, wherein the temporary adhesive can withstand a temperature of at least 200 degrees Celsius without releasing the second substrate from the second surface of the integrated circuit die.

20. The method of claim 14, wherein the stiffening structure is disposed around a perimeter of the integrated circuit die.

* * * * *